(12) United States Patent
Koshita

(10) Patent No.: US 7,760,572 B2
(45) Date of Patent: Jul. 20, 2010

(54) SEMICONDUCTOR MEMORY DEVICE AND REFRESH CONTROL METHOD

(75) Inventor: Gen Koshita, Toyko (JP)

(73) Assignee: Elpida Memory, Inc., Tokyo (JP)

( * ) Notice: Subject to any disclaimer, the term of this patent is extended or adjusted under 35 U.S.C. 154(b) by 299 days.

(21) Appl. No.: 11/986,537

(22) Filed: Nov. 21, 2007

(65) Prior Publication Data

US 2008/0181041 A1    Jul. 31, 2008

(30) Foreign Application Priority Data

Nov. 28, 2006    (JP) ............................ P2006-320160

(51) Int. Cl.
*G11C 7/00* (2006.01)
(52) U.S. Cl. ................... 365/222; 365/230.03; 365/236
(58) Field of Classification Search ................. 365/222, 365/230.03, 236, 233, 226, 230.08, 194, 365/227, 189.07, 189.05, 189.03
See application file for complete search history.

(56) References Cited

U.S. PATENT DOCUMENTS

| | | | | |
|---|---|---|---|---|
| 5,999,481 | A | * | 12/1999 | Cowles et al. ............. 365/233.1 |
| 7,260,011 | B2 | * | 8/2007 | Riho et al. .................. 365/222 |
| 2005/0243627 | A1 | * | 11/2005 | Lee et al. .................... 365/222 |
| 2006/0018174 | A1 | * | 1/2006 | Park et al. .................. 365/222 |

FOREIGN PATENT DOCUMENTS

| | | |
|---|---|---|
| JP | 08-077769 | 3/1996 |
| JP | 08-0777769 | 3/1996 |
| JP | 2001-035152 | 2/2001 |
| JP | 2003-187578 | 7/2003 |
| JP | 2006-099877 | 4/2006 |

OTHER PUBLICATIONS

Japanese Office Action dated Dec. 2 2008, with English-language translation.

* cited by examiner

*Primary Examiner*—Dang T Nguyen
(74) *Attorney, Agent, or Firm*—Scully, Scott, Murphy & Presser, P.C.

(57) ABSTRACT

A semiconductor memory device executes a refresh operation on memory banks, and includes: a command decoder that decodes a command from outside the semiconductor memory device, and outputs a refresh instruction when the command is an auto-refresh command; a refresh command generating unit that outputs a refresh command signal by a predetermined number of times corresponding to the number of word lines to be refreshed in response to the refresh instruction; a refresh address counter that counts up an address designating a memory bank and a word line every time the refresh command signal is output; and a refresh number controller that controls the number of times that refresh command signals are output so that each memory bank is refreshed and, after a count value for designating the word line of the refresh address counter has been changed, at least one of the memory banks is further refreshed.

8 Claims, 10 Drawing Sheets

SEMICONDUCTOR MEMORY DEVICE AND REFRESH CONTROL METHOD

BACKGROUND OF THE INVENTION

1. Field of the Invention

The present invention relates to a semiconductor memory device such as DRAM (Dynamic Random Access Memory), and, more particularly, to a refresh control method for refreshing memory cells connected to an arbitrary number of word lines, the number being set in advance, in response to an input single refresh command.

Priority is claimed on Japanese Patent Application No. 2006-320160 filed on Nov. 28, 2006, the content of which is incorporated herein by reference.

2. Description of the Related Art

A DRAM achieves storage of data by storing charges in capacitors. Because the charges in a capacitor leak with the passage of time, it is necessary to refresh memory cells in a given cycle. In the refresh operation, word lines of a DRAM are activated in order to read data in those memory cells which are connected to the activated word lines via bit lines, a potential difference between the bit lines is amplified using a sense amplifier, and the resultant data is rewritten into the original memory cells.

The specifications on an auto refresh control method for a DDR (Double Data Rate) 2 DRAM or the like define the frequency of generation of an auto refresh command that a DRAM controller, which controls the refresh operation, provided outside the DRAM should generate. For example, it is defined in the specifications of the DDR2 DRAM that the DRAM controller should generate an auto refresh command at least once in every 7.8 microseconds.

From the viewpoint of the DRAM, the refresh operation should be performed inside the DRAM to hold data of all the memory cells in response to an auto refresh command input at least at a frequency of 7.8 microseconds.

Achievement of this refresh operation employs a configuration that simultaneously refreshes memory cells connected to a plurality of word lines every time a refresh command is input to each memory bank (see Japanese Unexamined Patent Application, First Publication No. 2003-187578).

FIG. 5 is a block diagram showing a configurational example of a conventional semiconductor memory device which performs such a refresh operation. The following will describe a case where the semiconductor memory device has eight memory banks BANK0 to BANK7.

When a refresh command REF is input to a DRAM controller (not shown) as a command CMD, a command receiver/decoder 140 generates a refresh command signal REFA in response to the refresh command REF and outputs the refresh command signal REFA to a refresh operation controller 150, an X address counter 122 and an X address selector/buffer 160. The refresh command signal REFA indicates execution of a refresh operation.

When a command ACT (Activate) is input as a command CMD, the command receiver/decoder 140 generates a signal ACTA and outputs the signal ACTA to the X address selector/buffer 160. The signal ACTA indicates selection of an address A0-A13 input from outside the DRAM controller via an address receiver 130.

When the refresh command signal REFA is input, the refresh operation controller 150 outputs refresh control signals REF0 to REF7 to respective memory banks 100 to 170. Those refresh control signals instruct the respective memory banks to refresh memory cells therein. The refresh operation controller 150 respectively outputs the refresh control signals REF0 to REF7 to the eight memory banks once or twice in response to one refresh command signal REFA input, as shown in timing charts which will be referred to in the following description. Specific examples of the operation of the refresh operation controller 150 will be described later referring to FIGS. 6 to 9.

Each word line in a memory bank to be refreshed is designated by an X address XADD which is the value of an X address (row address) held in the X address counter 122. The X address counter 122 counts up the value of the X address XADD by one every time the refresh command signal REFA is input.

A description will be given of a case where the value of the X address XADD held in the X address counter 122 is 0 and those memory cells in every memory bank which are connected to a word line designated by the X address XADD=0 are refreshed.

The X address selector/buffer 160 selects and outputs either the address A0-A13 input from outside the DRAM controller via the address receiver 130 or the X address XADD output from the X address counter 122.

When the refresh command signal REFA is input, the X address selector/buffer 160 selects the X address XADD output from the X address counter 122, and outputs the selected X address XADD to an X address latch 101 of every memory bank.

Each of the memory banks 100 to 170 respectively corresponding to the memory banks BANK0 to BANK7 refreshes memory cells in the memory banks based on the input X address XADD and the refresh control signals REF0 to REF7.

Referring now to timing charts shown in FIGS. 6 to 9, the description of the refresh operation of the semiconductor memory device shown in FIG. 5 will be given for four cases.

FIG. 6 is a timing chart illustrating the operation in the case where all of the eight memory banks are refreshed at the same time upon reception of the refresh command REF. Because all of the eight memory banks are refreshed simultaneously in FIG. 6, there arise a noise problem and a current problem both originated from a peak current.

FIG. 7 is a timing chart illustrating the operation in the case where upon reception of the refresh command REF, a half of the eight memory banks (BANK0 to BANK3) are refreshed first, and the remaining memory banks (BANK4 to BANK7) are refreshed after a given time elapses.

FIG. 8 is a timing chart illustrating the operation in the case where upon reception of the refresh command REF, the memory banks are refreshed sequentially every time a given time elapses.

Because the number of the memory banks to be refreshed simultaneously in FIGS. 7 and 8 becomes smaller than that in FIG. 6, the noise problem and the current problem both originated from the peak current are reduced.

In any of the cases in FIGS. 6 to 8, each memory bank refreshes memory cells connected to a single word line in response to a single refresh command REF input.

FIG. 9 is a timing chart illustrating the operation in the case where each memory bank refreshes those memory cells which are connected to two word lines in response to one refresh command REF input. To make an apparent improvement of the refresh efficiency of such a refresh operation, even when the capacity of the DRAM is increased, an auto refresh command which is input at the frequency of 7.8 microseconds can permit data in all the memory cells to be retained. In FIG. 9, however, noise generated becomes twice or so as large as noise in FIGS. 6 to 8, thus resulting in increased power consumption.

Consideration will be given to a relation between a data hold time tREF where data in memory cells can be retained without refreshing and the number, n, of word lines to be refreshed in accordance with a single auto refresh command (which hereinafter will occasionally be called "refresh word line number").

For example, consideration will be given to a case where in a 1-G bits (64 M bits×16) DDR2 DRAM, 8192 (the number of word lines corresponding to a 13-bit row address)×8 (the number of banks)=64 K word lines are to be refreshed. As the time needed for refreshing all the word lines is 7.8 microseconds×64 K/n, the following equation 1 should be met.

$$tREF \geq 7.8 \text{ microseconds} \times 64 \text{ K}/n \quad (1)$$

As derived from the equation 1, when the data hold time tREF is 64 ms or longer, the number of word lines n can be 8, whereas when the data hold time tREF is 32 ms, the number of word lines n should be 16 (see FIG. 10).

In other words, when the number of word lines n is 16, the data hold time tREF needs to be 32 ms, whereas when the number of word lines is 8, the data hold time tREF needs to be 64 ms or longer.

The refresh word line number n should apparently be set equal to or greater than a certain number depending on the data hold time tREF. However, the refresh word line number n cannot be set indiscriminately large for a time tRFC from reception of the auto refresh command till completion of the auto refresh operation is determined by the specifications.

Assume a case where a refresh operation is performed for n word lines in a time-divisional manner while the word lines are activated one at a time. In this case, given that tRC is a time needed to refresh memory cells for one word line, the following equation 2 should be met.

$$n \times tRC \leq tRFC \quad (2)$$

However, the specifications (standards) for tRC and tRFC define that the refresh word line number n is 3 or so at the maximum. If the time needed to perform a refresh operation for all the word lines exceeds the data hold time tREF, therefore, data in all the memory cells cannot be retained.

To increase the refresh word line number n, it is essential to operate a semiconductor memory device in manners explained above referring to FIGS. 6, 7, and 9. This operation however increases the peak current in proportion to the refresh word line number n, thus raising a problem of malfunction caused by noise which is originated from the increased peak current. Furthermore, the average consumed current during the auto refresh period becomes larger in proportion to the refresh word line number n, which is disadvantageous for the whole system using the DRAM from the viewpoint of the average consumed current.

As is apparent from the above, the refresh word line number n to be subjected to a refresh operation per a single auto refresh command should be determined in consideration of factors, such as the value of the data hold time tREF of the DRAM, the peak current at the time of refreshing, and the average consumed current.

FIG. 10 is a graph representing a relation between the refresh word line number n and the mentioned factors. In FIG. 10, the consumed current Icc is a relative value when the current value is set to 100% with the refresh word line number n being 8. As can be understood from FIG. 10, if the refresh word line number n can be changed arbitrarily in accordance with the data hold time tREF, the consumed current can be reduced by selecting a minimum refresh word line number n corresponding to the value of the data hold time tREF.

However, the configuration employed in the related art cannot arbitrarily set the value of the refresh word line number n. Changing the refresh word line number n in the related art is achieved by a method which degenerates a specific bit of the address (i.e., which does not use the specific bit as an address for a refresh operation) to simultaneously refresh memory cells connected to a plurality of word lines. In this case, the value of the refresh word line number n is limited to an integer multiple (multiple of 8) of the number of the memory banks.

SUMMARY OF THE INVENTION

In one embodiment, there is provided a semiconductor memory device that executes a refresh operation on a plurality of memory banks installed therein, and includes: a command decoder that decodes a command input from outside the semiconductor memory device, and outputs a refresh instruction when the command input is detected to be an auto-refresh command based on a decoding result; a refresh command generating unit that outputs a refresh command signal by a predetermined number of times corresponding to the number of word lines to be subjected to the refresh operation in response to the refresh instruction; a refresh address counter that counts up an address designating a memory bank and a word line every time the refresh command signal is output; and a refresh number controller that controls the number of times that refresh command signals are output so that each plurality of the memory banks is refreshed and, after a count value for designating the word line of the refresh address counter has been changed, at least one memory banks is further refreshed.

In another embodiment, there is provides a semiconductor memory device that includes: a command decoder that recognizes a refresh command received from outside the semiconductor memory device and output a refresh instruction signal; a refresh number control circuit that control the number of times that internal refresh signals for refreshing memory cells are output; and a refresh command generating circuit that outputs the internal refresh signals in accordance with the refresh number control circuit, wherein the refresh number control circuit controls the number of times that the internal refresh signals are output so that each of a plurality of banks is refreshed and, after a count value for designating a word line of a refresh address counter has been changed, at least one of the banks is further refreshed.

In yet another embodiment, there is provided a semiconductor memory device that includes: a command decoder that recognizes a refresh command received from outside the semiconductor memory device and outputs internal instructions signal; a refresh command generating circuit that outputs internal refresh signals in response to the refresh instruction signal; and a refresh number control circuit that controls the number of times that the internal refresh signals are output, wherein the refresh number control circuit controls the number of times that the internal refresh signals are output so that each of a plurality of banks is refreshed and, after a count value for designating a word line of a refresh address counter has been changed, at least one of the banks is further refreshed.

According to the foregoing embodiments, when a single refresh command is input, the number of word lines of a semiconductor memory device to be subjected to a refresh operation can be set to an arbitrary number. Accordingly, the number of word lines that makes a consumed current lower at the time of refreshing a memory bank can be set. This can reduce the consumed current as well as the average consumed current during the auto refresh period 4

According to the foregoing embodiments, when a single refresh command is input, refresh control signals for performing a refresh operation are output in order at predetermined time intervals. This can reduce malfunctions caused by noise originating from the peak current.

DETAILED DESCRIPTION OF THE INVENTION

Figure 1:
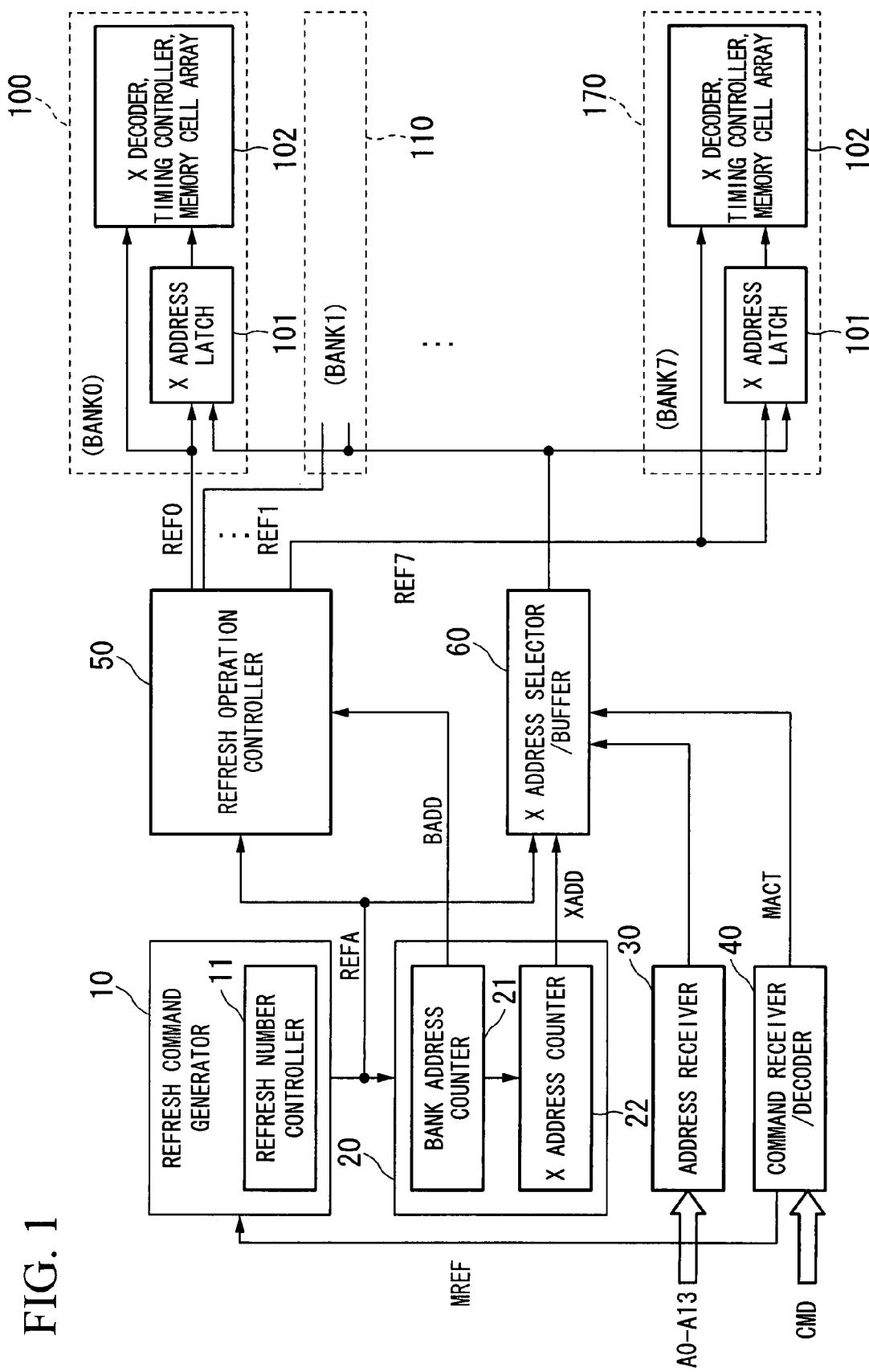
FIG. 1 is a block diagram showing an example of the configuration of a semiconductor memory device in accordance with one embodiment of the present invention.

An embodiment of the present invention will now be described with reference to the accompanying drawings. FIG. 1 is a block diagram showing the schematic configuration of a semiconductor memory device in accordance with the present embodiment. As the present invention relates to a refresh operation, a description will be given only of signals relevant to the refresh operation and control therefor.

The semiconductor memory device of the present embodiment is a DRAM which performs a refresh operation. The DRAM includes a refresh command generator 10, a counter circuit 20, an address receiver 30, a command receiver/decoder 40, a refresh operation controller 50, and an X address selector/buffer 60. It is assumed that there are eight memory banks, a memory bank 100 (bank 0) to a memory bank 170 (bank 7), which are to be controlled by those components 10 to 60. Because the memory banks have the same configuration, FIG. 1 does not show all the memory banks but shows specific configurations of only the memory banks 100 and 170.

The command receiver/decoder 40 decodes a command CMD input from an external DRAM controller. When the decoded command CMD is an auto refresh command, the command receiver/decoder 40 generates a refresh execution signal MREF which indicates execution of a refresh operation, and outputs the generated refresh execution signal MREF to the refresh command generator 10.

When the decoded command CMD is a command ACT instructing the semiconductor memory device to activate word lines, the command receiver/decoder 40 generates a signal MACT and outputs the generated signal MACT to the X address selector/buffer 60. The signal MACT is for selecting an address A0-A13 externally input via the address receiver 30 as an X address corresponding to a word line to be activated.

The refresh execution signal MREF and the signal MACT are pulse signals of predetermined widths (H (High) level or L (Low) level).

The refresh command generator 10 includes a refresh number controller 11.

Upon reception of the refresh execution signal MREF from the command receiver/decoder 40, the refresh command generator 10 generates a refresh command signal REFA and outputs the generated refresh command signal REFA to the counter circuit 20, the refresh operation controller 50, and the X address selector/buffer 60. The refresh command signal REFA is generated at predetermined intervals and by a predetermined number of times (n times), the intervals and the number n being determined inside the refresh command generator 10.

The detailed configurations of the refresh command generator 10 and the refresh number controller 11 will be described later referring to FIGS. 2 and 3.

The counter circuit 20 includes a bank address counter 21 and an X address counter 22. The bank address counter 21 counts up a bank address BADD, which designates a memory bank, every time the refresh command signal REFA is input. The X address counter 22 counts up an X address XADD which designates a word line to be activated.

When the most significant bit of the bank address BADD changes from "1" to "0" (i.e., when the most significant bit of the bank address BADD is carried over), the X address XADD is counted up.

The bank address counter 21 outputs the bank address BADD to the refresh operation controller 50. The X address counter 22 outputs the X address XADD to the X address selector/buffer 60.

The number of memory banks to be subjected to refresh control ("8" in this case) is set in the bank address counter 21, which executes a carry-over process in accordance with the set number of memory banks.

The value of the number of word lines of each memory bank to be subjected to refresh control is set in the X address counter 22. The X address counter 22 counts up the X address XADD up to the value of the set number of word lines. At the time of counting up with the value of the set number of word lines, the X address counter 22 sets the value of the X address XADD back to 0 and counts up the X address XADD again.

The bank address counter 21 and the X address counter 22 that constitute the counter circuit 20 hold count values even after a single refresh process is completed. Every time an auto refresh command is input from the DRAM controller, therefore, the counter circuit 20 sequentially counts up the bank address BADD and the X address XADD (when carry-over takes place from the most significant bit), thereby making it possible to refresh memory cells connected to all the word lines of a memory bank.

When receiving the refresh command signal REFA from the refresh command generator 10, the refresh operation controller 50 outputs a refresh control signal REFi (i being one of integers 0 to 7) corresponding to the bank address BADD input from the bank address counter 21 for a given period, thereby controlling the refresh operation of the corresponding memory bank (one of the memory banks 100 to 170).

More specifically, the refresh operation controller 50 outputs a refresh control signal REF0 for controlling the refreshing of the memory bank 100, a refresh control signal REF1 for controlling the refreshing of the memory bank 110, ..., or a refresh control signal REF7 for controlling the refreshing of the memory bank 170 to the corresponding memory bank 100, 110, ..., or 170.

Information on the length of a period during which the refresh control signal REFi is output is preset in the refresh operation controller 50 in accordance with the specifications on the refresh period operation of a memory bank to be controlled, so that the refresh operation controller 50 outputs the refresh control signal REFi in accordance with the information.

Alternatively, the refresh operation controller 50 may output the refresh control signal REFi for a given period as follows.

First, the refresh operation controller 50 outputs the refresh control signal REFi to the corresponding memory bank. This memory bank starts a refresh process upon reception of the refresh control signal REFi from the refresh operation controller 50. When the refresh process is completed or after a given period elapses, the memory bank outputs a refresh end signal indicating the completion of the refresh process to the refresh operation controller 50. In response to the refresh end signal received from each memory bank, the refresh operation controller 50 stops outputting the refresh control signal REFi to the corresponding memory bank. In this manner, the refresh operation controller 50 outputs the refresh control signal REFi in accordance with the length of the period needed for the refresh process.

When the refresh command signal REFA is input from the refresh command generator 10 (i.e., when the command CMD from the DRAM controller is the auto refresh command), the X address selector/buffer 60 selects the X address XADD output from the X address counter 22 and outputs the selected X address XADD to each memory bank.

When the signal MACT is input from the command receiver/decoder 40 (i.e., when the command CMD from the DRAM controller is the command ACT), the X address selector/buffer 60 selects the address A0-A13 externally input via the address receiver 30 and outputs the selected address A0-A13 to each memory bank.

Because the refresh command signal REFA and the signal MACT are both pulse signals of given periods, the X address selector/buffer 60 outputs the X address XADD or the address A0-A13 to each memory bank in accordance with the refresh command signal REFA or the signal MACT input, and holds the output X address XADD or address A0-A13 until the next refresh command signal REFA or signal MACT is input.

Each of the memory banks 100 to 170 has various circuits. Only those of the circuits of each memory bank which are associated with the refresh operation will be described. The following will describe those circuits of the memory bank 100 which are associated with the refresh operation.

The memory bank 100 includes an X address latch 101 and a circuit block 102 for the bank 0. The circuit block 102 includes an X decoder which decodes an address output from the X address latch 101, a timing controller which controls various timings in the memory bank 100, and a memory cell array.

The X address latch 101 latches and outputs an address output from the X address selector/buffer in accordance with the refresh control signal REF0 from the refresh operation controller 50.

The circuit block 102 refreshes the memory cells connected to a word line designated by the address output from the X address latch 101 in accordance with the refresh control signal REF0 from the refresh operation controller 50.

The memory banks 110 to 170 respectively correspond to the banks 1 to 7, and have configurations and functions similar to those of the memory bank 100.

Figure 2:
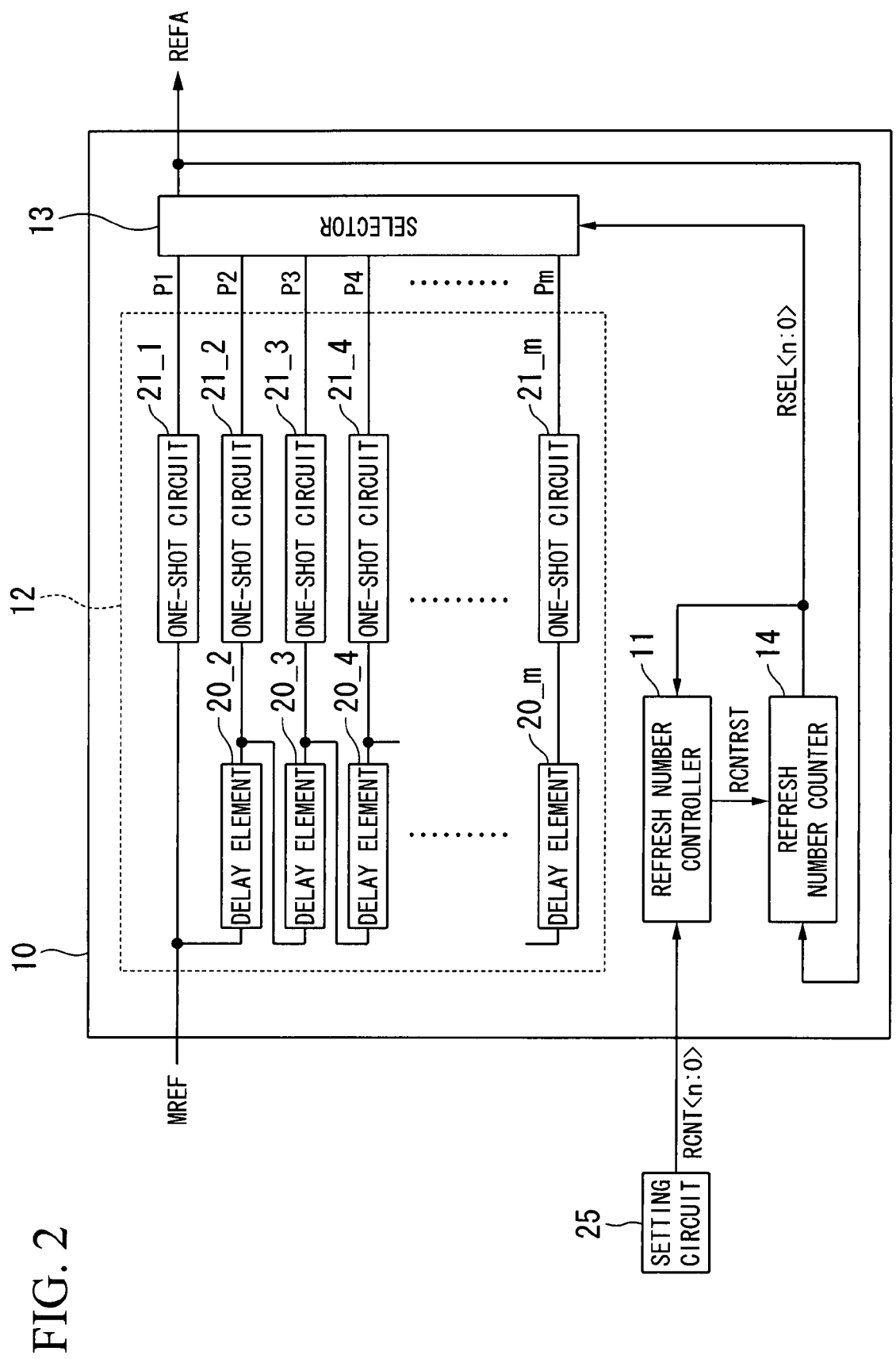
FIG. 2 is a block diagram showing an example of the configuration of a refresh command generator as shown in FIG. 1.
Figure 3:
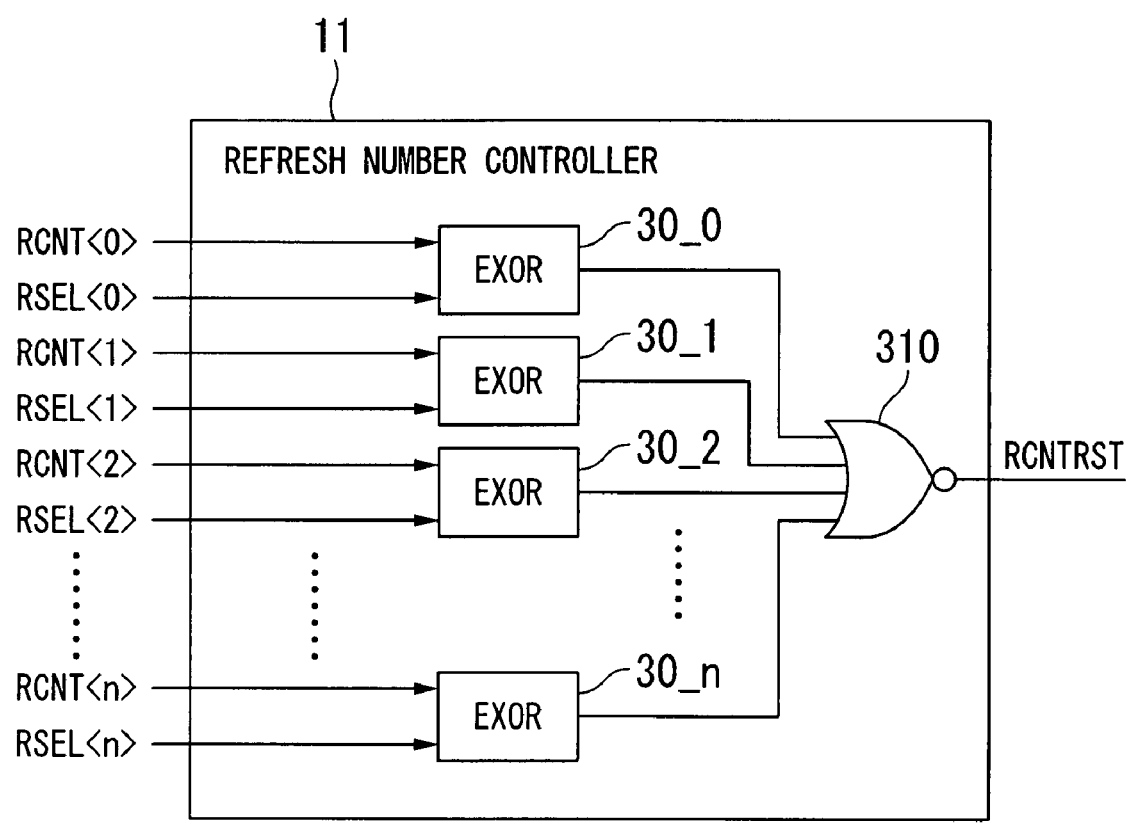
FIG. 3 is a block diagram showing an example of the configuration of a refresh number controller as shown in FIG. 2.

The configurations of the refresh command generator 10 and the refresh number controller 11 will be elaborated referring to FIGS. 2 and 3.

When the refresh execution signal MREF, which is a trigger signal to generate a refresh command, changes from an L level to an H level, the refresh command generator 10 outputs pulses of the refresh command signal REFA by a predetermined number of times at predetermined timings.

FIG. 2 shows one example of the configuration of the refresh command generator 10.

The refresh execution signal MREF is input to a refresh timing generator 12. When detecting a change in the level of the refresh execution signal MREF from the L level to the H level, the refresh timing generator 12 outputs one-shot pulse signals P1 to Pm (m=$2^{n+1}$) one after another at predetermined time intervals.

The time interval at which adjacent one-shot pulses are generated is controlled with delay times of delay elements 20_2 to 20_m. To make the time intervals for generation of all the one-shot pulses the same, therefore, the delay elements 20_2 to 20_m need to have the same delay time.

One-shot circuits 21_1 to 21_m respectively output pulses having predetermined durations as the one-shot pulse signals P1 to Pm.

The one-shot pulse signals P1 to Pm output from the refresh timing generator 12 are input to a selector 13. The selector 13 determines which one of the one-shot pulse signals P1 to Pm is to be output based on a select signal RSEL<n:0>. Specifically, the selector 13 decodes the select signal RSEL<n:0>, and selects one of $2^{n+1}$ one-shot pulse signals in accordance with the decoding result.

The select signal RSEL<n:0> is output from a refresh number counter 14. The refresh number counter 14 counts up the refresh command signal REFA received. Upon reception of a signal RCNTRST, the refresh number counter 14 is reset to set the count value back to an initial value.

The signal RCNTRST is output from the refresh number controller 11. The refresh number controller 11 generates the signal RCNTRST using a refresh number set signal RCNT<n:0>, output from outside the refresh command generator 10, and the select signal RSEL<n:0>.

The refresh number set signal RCNT<n:0> is preset by a setting circuit 25 provided outside the refresh number controller 11. For example, the setting circuit 25 is a physical combination of fuses or a non-volatile storage medium, such as a ROM (Read Only Memory), where electric bit information is stored.

In case of a physical combination of fuses, the refresh number is set by a combination of cut fuses and uncut fuses. As a voltage corresponding to the combined fuses is input to the refresh number controller 11, the refresh number controller 11 sets the refresh number, i.e. the number of refresh operations.

In case of a non-volatile storage medium, electric bit information in a combination of an H level or L level is stored, and the refresh number controller 11 sets the refresh number as such bit information is input thereto.

Next, a configurational example of the refresh number controller 11 will be described referring to FIG. 3.

The refresh number set signal RCNT<n:0> and the select signal RSEL<n:0> are input to EXORs (exclusive ORs) 30_0 to 30_n bit by bit. The outputs of the EXORs 30_0 to 30_n are input to a NOR 310. The output of the NOR 310 is the signal RCNTRST.

When the refresh number set signal RCNT<0> matches with the select signal RSEL<0>, for example, the EXOR 30_0 outputs an L level. Likewise, when the refresh number set signal RCNT<n:1> matches with the select signal RSEL<n:1>, the EXORs 30_n to 30_1 output L levels. Only when all the inputs of the NOR 310 are L levels, the NOR 310 outputs an H level. Therefore, only when the refresh number set signal RCNT<n:0> matches in every bit with the select signal RSEL<n:0>, the refresh number controller 11 outputs an H level as the signal RCNTRST.

Next, a description of a specific operation will be given of a case where the refresh command signal REFA containing 12 pulses is output.

Let the least significant bits of the refresh number set signal RCNT<n:0> and the select signal RSEL<n:0> be RCNT0 and RSEL0, respectively, and let the most significant bits be RCNTn and RSELn, respectively. In this example, with n=3, each of the refresh number set signal RCNT<n:0> and the select signal RSEL<n:0> is a 4-bit signal.

The refresh number set signals RCNT0, RCNT1, RCNT2, and RCNT3 are respectively set to H, H, L, and H levels. The select signals RSEL0, RSEL1, RSEL2, and RSEL3 are all set to L levels (i.e., count value of 0) first, and the count value of the refresh number counter 14 is counted up upon reception of the refresh command signal REFA.

When the count value becomes 11 (decimal notation) (i.e., the select signals RSEL0, RSEL1, RSEL2, and RSEL3 respectively become H, H, L and H levels), all the bits match with those of the refresh number set signal RCNT, so that the refresh number controller 11 outputs an H level as the signal RCNTRST.

When the H-level signal RCNTRST is input from the refresh number controller 11, the refresh number counter 14 sets the count value back to 0. That is the count value of the refresh number counter 14 does not become 12 and returns to 0 after 11.

The above-described operations of the refresh command generator 10 and the refresh number controller 11 as illustrated in FIG. 2 and the 3 cause the refresh command signal REFA to be output 12 times in association with count values of 0 to 11 of the select signals RSEL.

Figure 4:
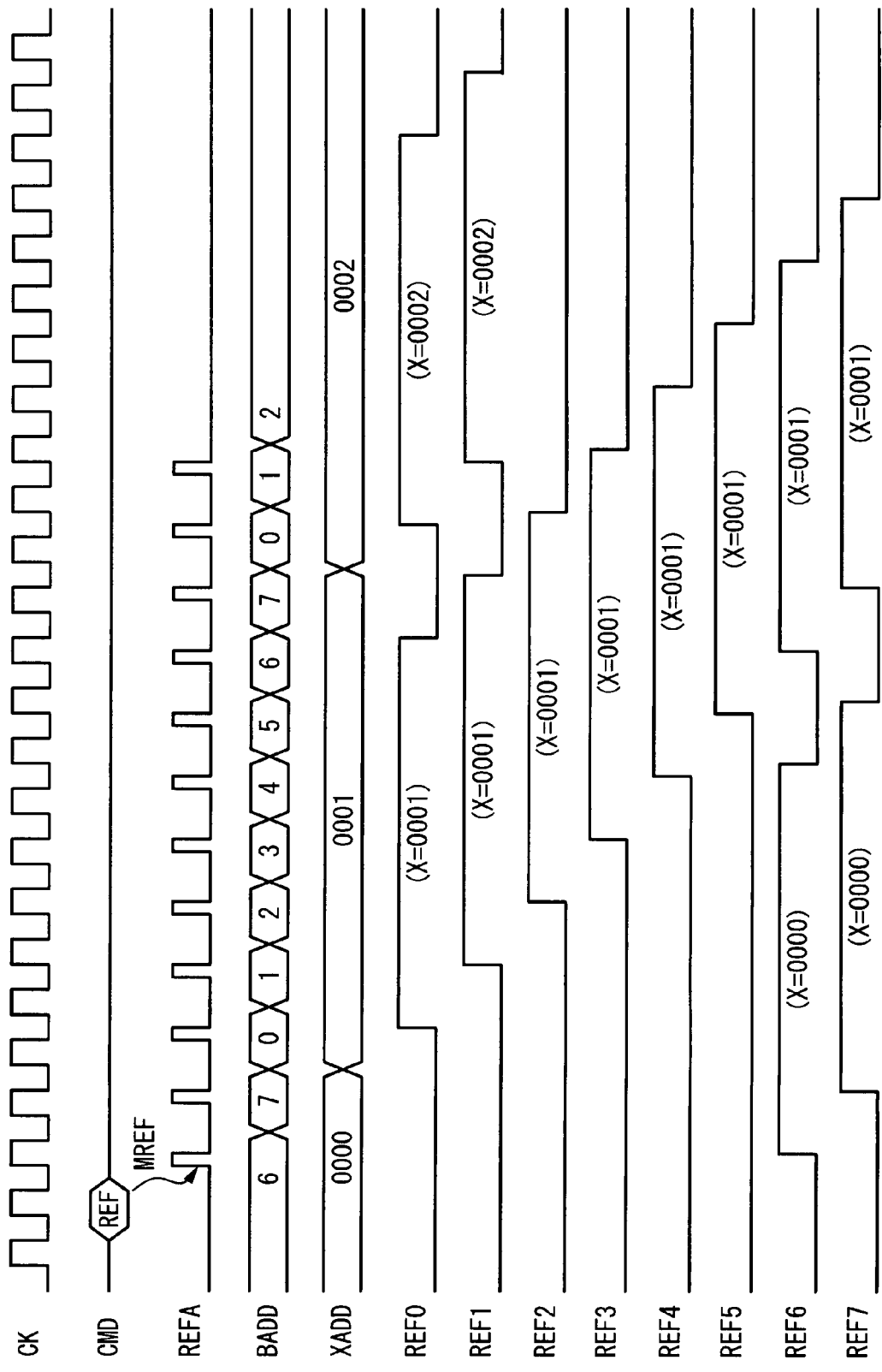
FIG. 4 is a timing chart illustrating the operation of the semiconductor memory device shown in FIG. 1.
Figure 5:
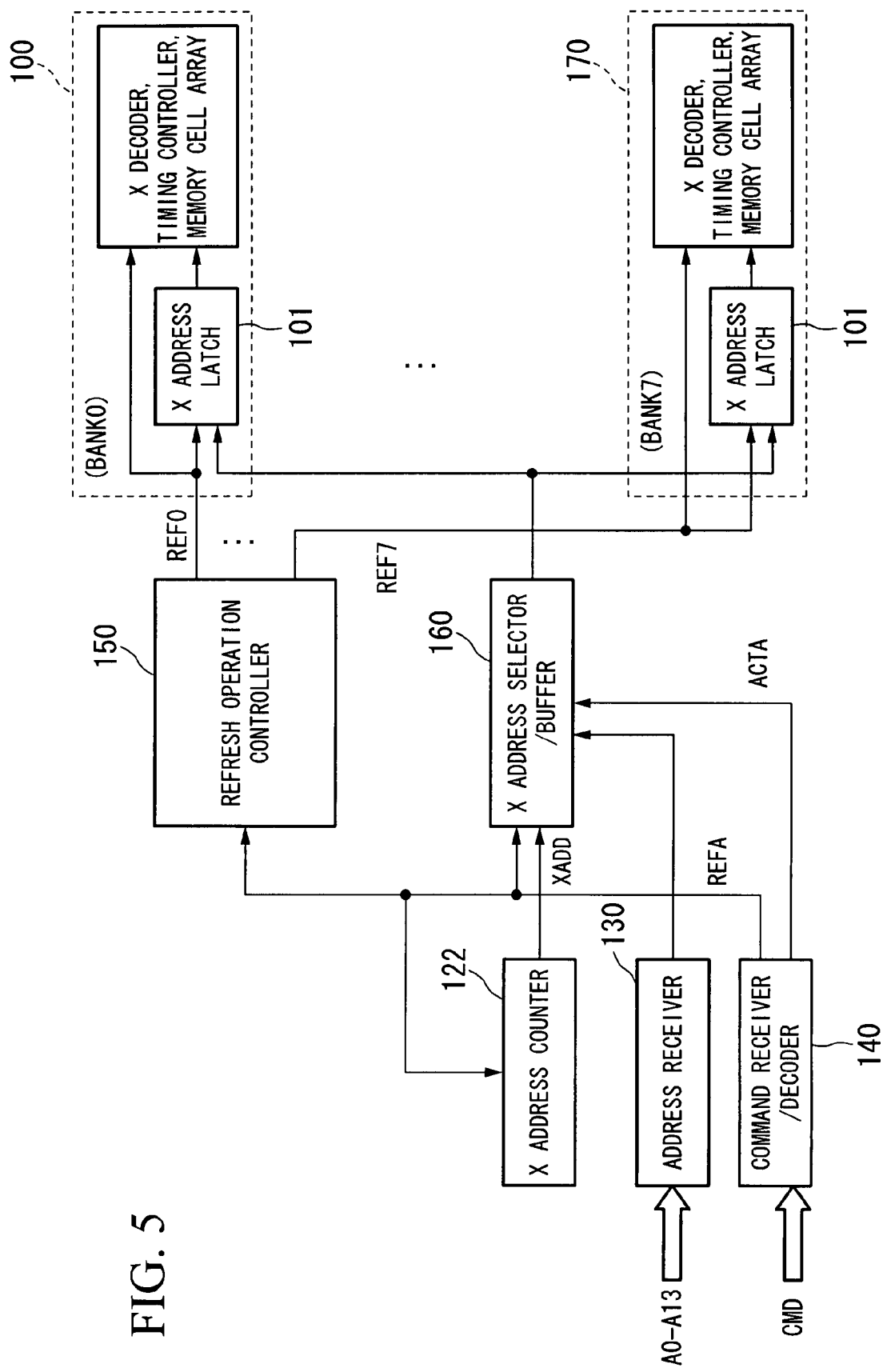
FIG. 5 is a block diagram showing the configuration of a conventional semiconductor memory device.
Figure 6:
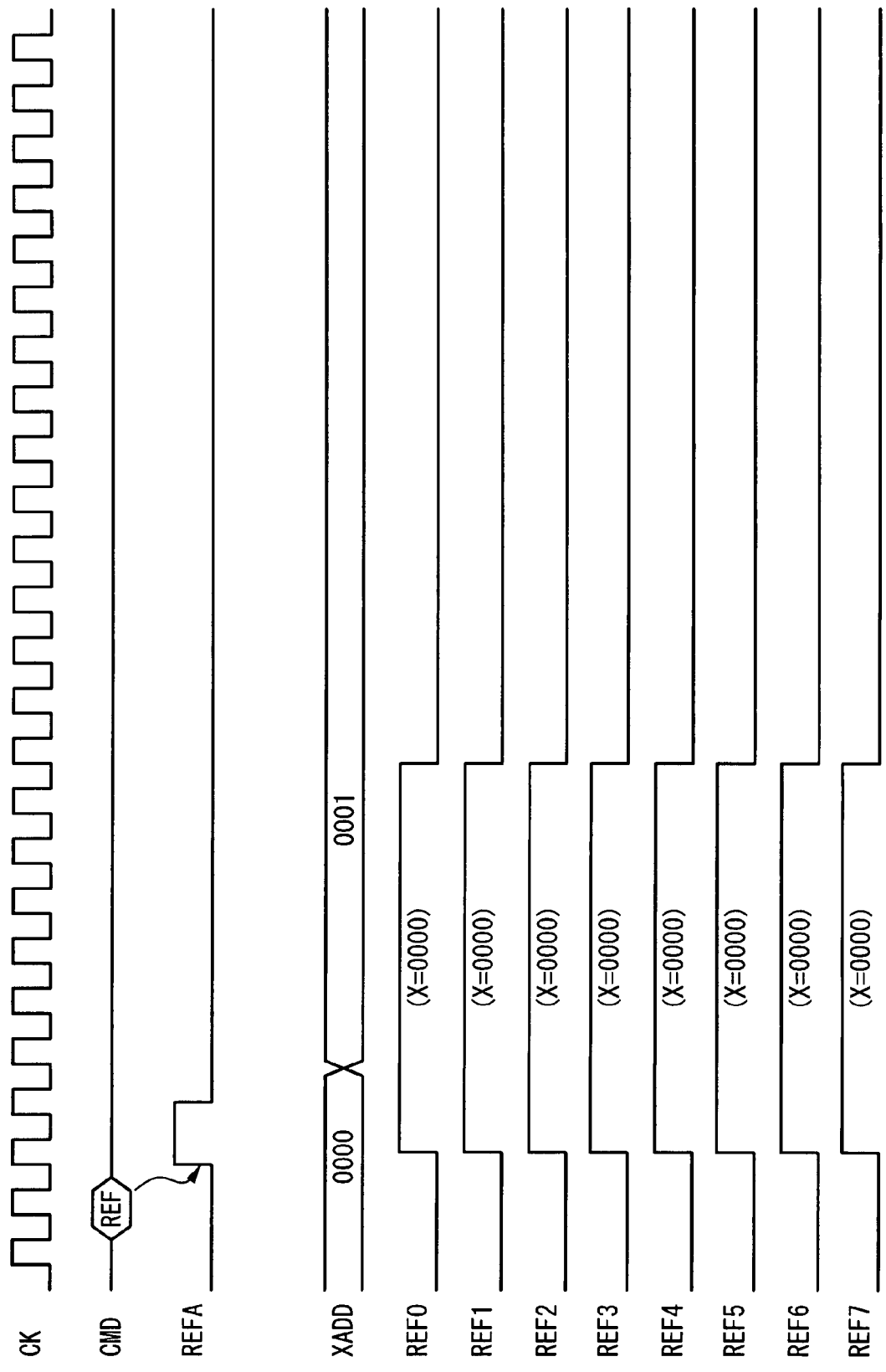
FIG. 6 is a first timing chart illustrating the operation of the semiconductor memory device shown in FIG. 5.
Figure 7:
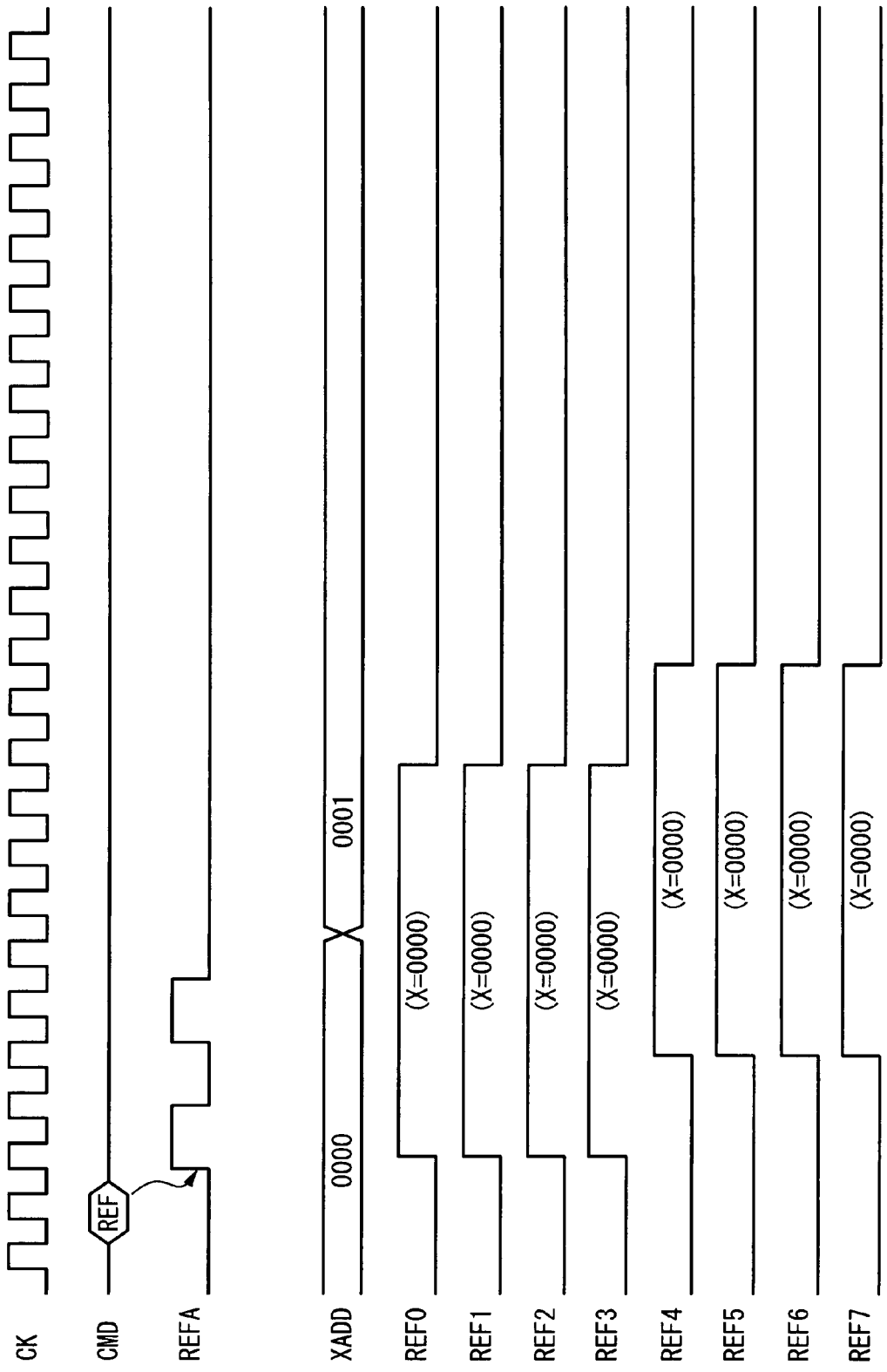
FIG. 7 is a second timing chart illustrating the operation of the semiconductor memory device shown in FIG. 5.
Figure 8:
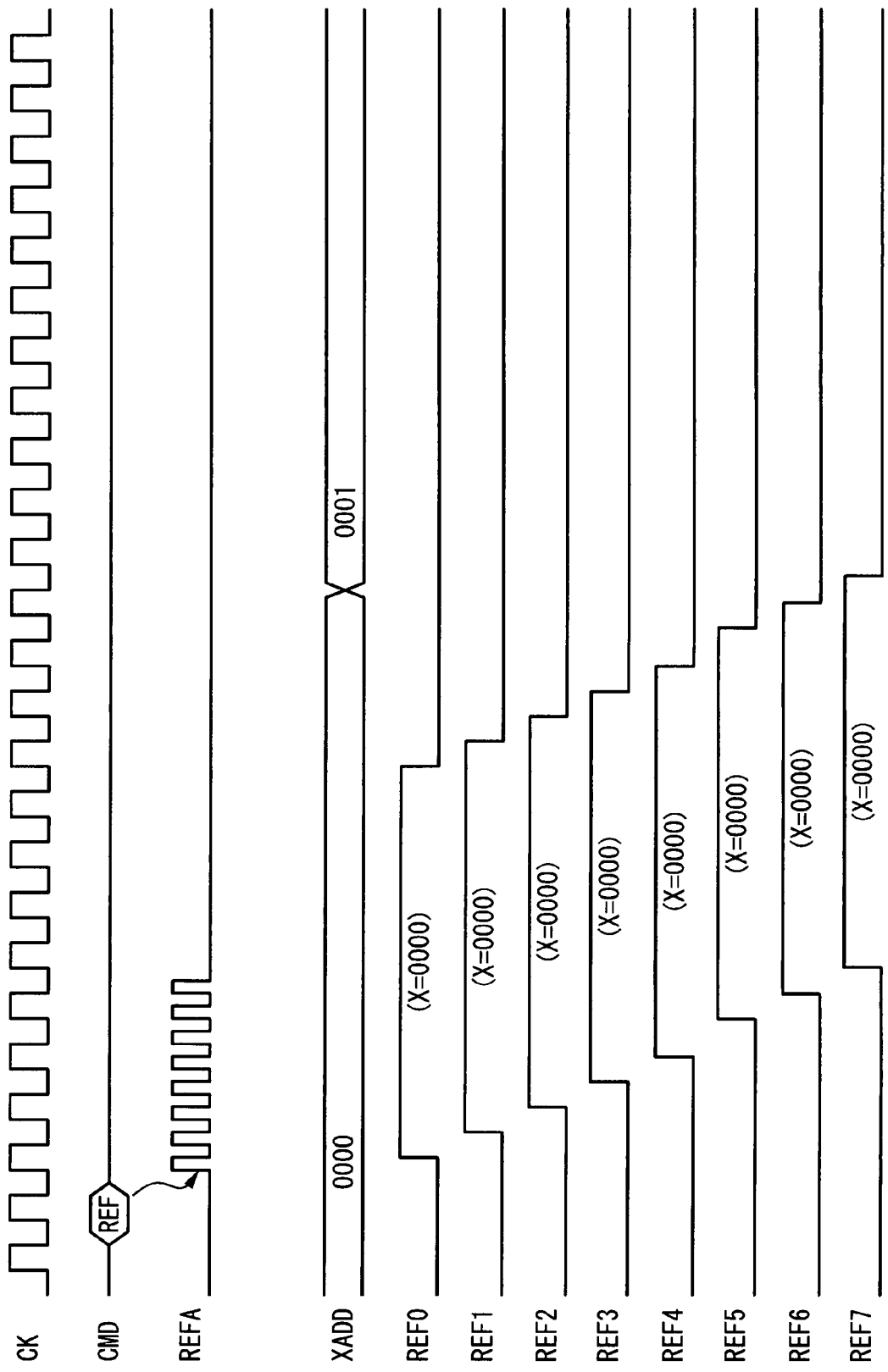
FIG. 8 is a third timing chart illustrating the operation of the semiconductor memory device shown in FIG. 5.
Figure 9:
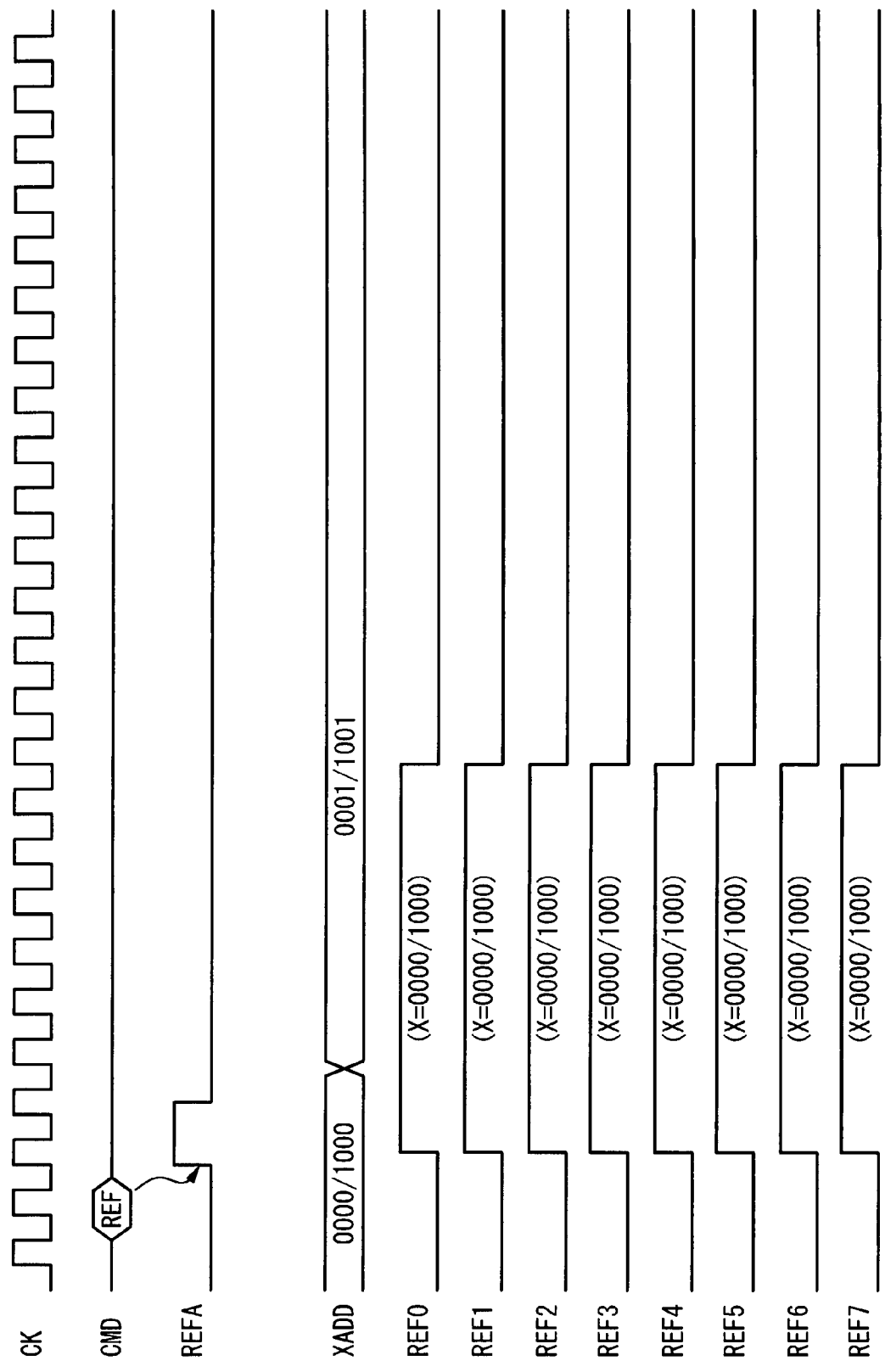
FIG. 9 is a fourth timing chart illustrating the operation of the semiconductor memory device shown in FIG. 5.
Figure 10:
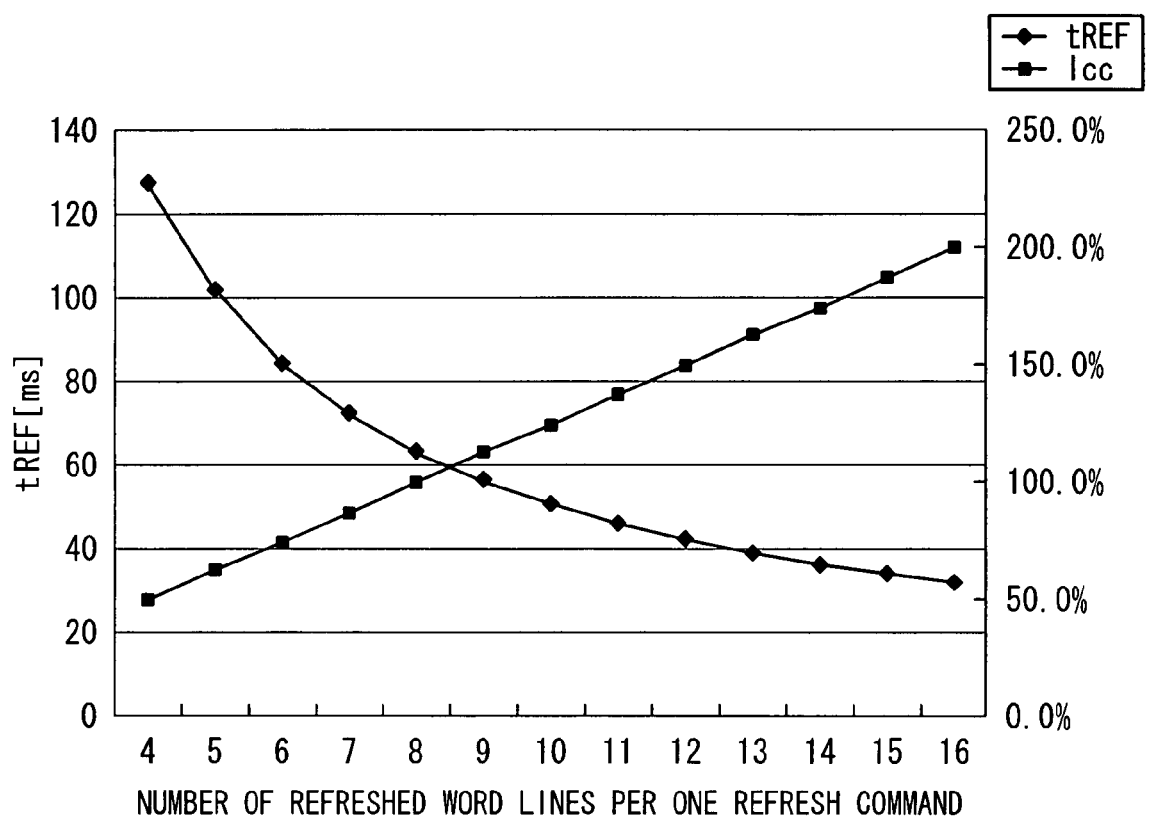
FIG. 10 is a graph showing a relation between a refresh word line number n and a data hold time tREF, and a relation between the refresh word line number n and a consumed current Ice.

Next, an example of the refresh operation of the semiconductor memory device shown in FIG. 1 will be described using a timing chart shown in FIG. 4. It is assumed that the number of word lines, n, which are to be subjected to a refresh operation by a single auto refresh command is 12. The timing chart shown in FIG. 4 will be explained in association with the block diagram of FIG. 1.

It is also assumed that the command CMD input from the DRAM controller is the auto refresh command, the value of a bank address held in the bank address counter 21 is 6, and the value of an X address held in the X address counter 22 is "0000".

First, when the auto refresh command is input as the command CMD from the DRAM controller, the command receiver/decoder 40 decodes the input command CMD and outputs the refresh execution signal MREF to the refresh command generator 10.

Upon reception of the refresh execution signal MREF from the command receiver/decoder 40, the refresh command generator 10 generates the refresh command signal REFA at predetermined intervals, and outputs the refresh command signal REFA to the counter circuit 20, the refresh operation controller 50, and the X address selector/buffer 60 twelve times in total.

As mentioned above, the value of the bank address BADD held first by the bank address counter 21 is 6 and the value of the X address XADD held by the X address counter 22 is "0000".

When the first refresh command signal REFA is input, therefore, the refresh operation controller 50 outputs the refresh control signal REF6 to a memory bank corresponding to the bank 6, and the X address selector/buffer 60 outputs the value "0000" of the X address XADD to each memory bank. Accordingly, memory cells connected to a word line corresponding to the value "0000" of the X address of the bank 6 are refreshed.

When the first refresh command signal REFA is input, the bank address counter 21 counts up the bank address BADD and outputs the value 7 of the bank address BADD.

Next, when the second refresh command signal REFA is input, the refresh operation controller 50 outputs the refresh control signal REF7 to the memory bank 170, and the X address selector/buffer 60 outputs the value "0000" of the X address XADD to each memory bank. Accordingly, memory cells connected to a word line corresponding to the value "0000" of the X address of the memory bank 170 are refreshed.

When the second refresh command signal REFA is input, the bank address counter 21 counts up the bank address BADD. The count-up results in a carry-over from the most significant bit, and the bank address counter 21 outputs the value 0 of the bank address BADD.

When the most significant bit of the of the bank address BADD carries over, the bank address counter 21 outputs a carry-over signal to the X address counter 22. As a result, the X address counter 22 counts up too, and the X address counter 22 outputs "0001" as the value of the X address.

Next, when the third refresh command signal REFA is input, the refresh operation controller 50 outputs the refresh control signal REF0 to the memory bank 100, and the X address selector/buffer 60 outputs the value "0001" of the X address XADD to each memory bank. Accordingly, memory cells connected to a word line corresponding to the value "0001" of the X address of the memory bank 100 are refreshed.

Likewise, every time the refresh command signal REFA is output from the refresh operation controller 50, the refresh operation is executed. As a result, in response to a single auto refresh command input from the DRAM controller, memory cells connected to 12 word lines are finally refreshed, the value of the memory bank address held in the bank address counter 21 becomes 2, and the value of the X address held in the X address counter 22 becomes "0002", after which the refresh process is completed.

When the auto refresh command is input as the command CMD from the DRAM controller thereafter, the semiconductor memory device executes a refresh process similar to the previous one using the value 2 of the memory bank address held in the bank address counter 21 and the value "0002" of the X address held in the X address counter 22 as new initial values.

Thereafter, every time the auto refresh command is input to the semiconductor memory device from the DRAM controller at a predetermined period, the count value of the bank address counter 21 is counted up by 12, and when the most significant bit of the value of the bank address counter 21 is carried over, the count value of the X address counter 22 is counted up, so that the memory cells connected to all the word lines of every memory bank of the semiconductor memory device are refreshed at last.

Next, a description will now be given of a method for setting the value of n when memory cells connected to n word lines are refreshed in response to a single refresh command.

The value of n is determined based on (1) a data hold time tREF of a device constituting a memory bank (storage retention time of memory cells), (2) the total number of word lines N, and (3) an input interval tREFi of the auto refresh command.

The total number N of word lines is the total number of word lines of one memory bank multiplied by the number of memory banks, and is the number of all the word lines of memory banks to be refreshed.

The time needed to perform a refresh operation for all the word lines is computed from the following equation 3. Therefore, the data hold time tREF of the device constituting a memory bank should be set to satisfy an equation 4.

$$tREFi \times N/n \quad (3)$$

$$tREFi \times N/n < tREF \quad (4)$$

In the equation 4, the total number N of word lines and the input interval tREFi of the auto refresh command are values determined depending on the specifications of each semiconductor memory device manufactured.

As the data hold time tREF differs from one device constituting a memory bank to another, the data hold time tREF is measured beforehand. The value of n is a natural number satisfying the following equation 5.

$$n > tREFi \times N/tREF \quad (5)$$

The smaller the value of n, the less the current at the time of the refresh operation, so that it is desirable to set the value of n to the smallest one of natural numbers which satisfy the equation 5.

Suppose that the total number of word lines N=65536 and the input interval of the auto refresh command tREFi=7.8 microseconds which conform to the specifications of a 1-Gbit DDR2 DRAM.

When the measurement result of the data hold time tREF is 64 ms, n>7.99, so that the value of n should be set to 8. When the data hold time tREF=32 ms, n>15.97, so that the value of n should be set to 16.

For those data hold times tREF, the consumed current can be made small as compared to a case of setting the value of n to 8 or 16 in the related art.

With the data hold time tREF=43 ms, for example, n>11.89, so that the value of n should be set to 12.

In the related art, however, even with the data hold time tREF being 43 ms, the value of n can be set only to a multiple of 8 like 8 or 16. If the value of n is set to 8, however, it is not possible to retain memory cell data, making it inevitable to set the value of n to 16.

According to the embodiment, however, with the data hold time tREF=43 ms, the value of n can be set to 12.

When the value of n is set to 12 in the present embodiment, it is sufficient that the consumed current is 75% (=12/16) of the case in the related art where the value of n is set to 16, thus making it possible to reduce the average consumed current.

As described above, the value of n can be set only to a multiple of 8 in the related art, whereas the value of n can be arbitrarily set in accordance with (1) the data hold time tREF of the device to be subjected to the refresh operation (storage retention time of memory cells), (2) the total number of word lines N, and (3) the input interval tREFi of the auto refresh command, thus making it possible to reduce the average consumed current.

The foregoing description of the present embodiment has been given for the case where the number of word lines n to be subjected to a refresh operation in response to a single refresh command is 12. However, the semiconductor memory device of the present invention is not limited to this case and is adaptable to any number of word lines n.

The foregoing description of the embodiment has been given for the case where the semiconductor memory device has eight memory banks. However, the semiconductor memory device of the present invention is not limited to this case and is adaptable to any number of memory banks. The set value of the carry-over number of the bank address counter 21 is set according to the number of memory banks to be controlled.

While preferred embodiments of the present invention have been described and illustrated above, it should be understood that these are exemplary of the present invention and are not to be considered as limiting. Additions, omissions, substitutions, and other modifications can be made without departing from the gist or scope of the present invention. Accordingly, the present invention is not to be considered as being limited by the foregoing description, and is only limited by the scope of the appended claims.

What is claimed is:

1. A semiconductor memory device comprising:
   a command decoder that recognizes a refresh command received from outside the semiconductor memory device and outputs a refresh instruction signal;
   a refresh number control circuit that controls a number of times that internal refresh signals for refreshing memory cells are output; and
   a refresh command generating circuit that outputs the internal refresh signals in accordance with the refresh number control circuit,
   wherein the refresh number control circuit controls the number of times that the internal refresh signals are output so that each of a plurality of banks is refreshed and, after a count value for designating a word line of a refresh address counter has been changed, at least one of the banks is further refreshed,
   wherein the refresh number control circuit comprises a refresh number counter circuit that measures the number of transitions of an internal signal for generating the internal refresh signals,
   and
   wherein the refresh number control circuit comprises a comparison unit that compares the number of the transitions of the internal signal with number-of-times information that has been determined in advance.

2. The semiconductor memory device as recited in claim 1, further comprising an address counter that generates a bank address designating a bank and a word line address designating a word line in the bank in response to each of the internal refresh signals.

3. The semiconductor memory device as recited in claim 2, wherein the address counter is configured to store the bank address as a lower address and to store the word line address as an upper address.

4. A semiconductor memory device comprising:
   a command decoder that recognizes a refresh command received from outside the semiconductor memory device and outputs a refresh instruction signal;
   a refresh command generating circuit that outputs internal refresh signals in response to the refresh instruction signal; and
   a refresh number control circuit that controls a number of times that the internal refresh signals are output, wherein the refresh number control circuit controls the number of times that the internal refresh signals are output so that each of a plurality of banks is refreshed and, after a count value for designating a word line of a refresh address counter has been changed, at least one of the banks is further refreshed, wherein the refresh number control circuit comprises a refresh number counter circuit that measures the number of times that the internal refresh signals are output, and wherein the refresh number control circuit comprises a comparison unit that determines whether or not the refresh number counter circuit counts up in response to the receipt of the internal refresh signals, by comparing the number of transitions of an internal signal for generating the internal refresh signals with number-of-times information that has been determined in advance.

5. The semiconductor memory device as recited in claim 4, wherein the comparison unit comprises a comparison circuit that compares the number of the transitions of the internal signal output from the refresh number counter circuit with the number-of-times information.

6. The semiconductor memory device as recited in claim 4, wherein the refresh command generating circuit selects one of a plurality of delay signals which are generated in response to the refresh instruction signal in accordance with the internal signal output from the refresh number counter circuit, and outputs the selected delay signal as one of the internal refresh signals.

7. The semiconductor memory device as recited in claim 4, further comprising an address counter that generates a bank address designating a bank and a word line address designating a word line in the bank in response to each of the internal refresh signals.

8. The semiconductor memory device as recited in claim 7, wherein the address counter is configured to store the bank address as a lower address and to store the word line address as an upper address.

* * * * *

UNITED STATES PATENT AND TRADEMARK OFFICE
CERTIFICATE OF CORRECTION

PATENT NO. : 7,760,572 B2
APPLICATION NO. : 11/986537
DATED : July 20, 2010
INVENTOR(S) : Gen Koshita It is certified that error appears in the above-identified patent and that said Letters Patent is hereby corrected as shown below:

Title Page, Item (75) Inventor should read Gen Koshita, Tokyo, (JP)

Signed and Sealed this

Twelfth Day of October, 2010

David J. Kappos
*Director of the United States Patent and Trademark Office*